(12) United States Patent
Divakaruni et al.

(10) Patent No.: US 6,420,750 B1
(45) Date of Patent: Jul. 16, 2002

(54) STRUCTURE AND METHOD FOR BURIED-STRAP WITH REDUCED OUTDIFFUSION

(75) Inventors: Ramachandra Divakaruni, Middletown; Jack A. Mandelman, Stormville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 09/635,203

(22) Filed: Aug. 9, 2000

Related U.S. Application Data

(62) Division of application No. 09/255,534, filed on Feb. 22, 1999.

(51) Int. Cl.[7] .................. H01L 27/108; H01L 29/76; H01L 29/94; H01L 31/119
(52) U.S. Cl. .................. 257/302; 257/327; 438/268; 438/269; 438/270
(58) Field of Search .................. 438/268, 269, 438/270; 257/302, 327

(56) References Cited

U.S. PATENT DOCUMENTS 6,074,909 A * 6/2000 Gruening .................. 438/242

* cited by examiner

Primary Examiner—Wael Fahmy
Assistant Examiner—William M. Brewster
(74) Attorney, Agent, or Firm—McGinn & Gibb, PLLC; Todd M.C. Li

(57) ABSTRACT

A method and structure for forming an integrated circuit memory device includes forming a trench conductor in a trench, forming an isolation collar along a perimeter of an upper portion of the trench conductor, forming supporting spacers above the isolation collar, forming a sacrificial layer between the supporting spacers along an upper surface of the trench conductor, forming an insulator above the sacrificial layer, forming a gate conductor above the insulator, removing the sacrificial layer to form a gap between the insulator and the trench conductor, wherein the supporting spacers maintain a relative position of the gate conductor, the insulator and the trench conductor and forming a conductive strap in the gap.

15 Claims, 5 Drawing Sheets

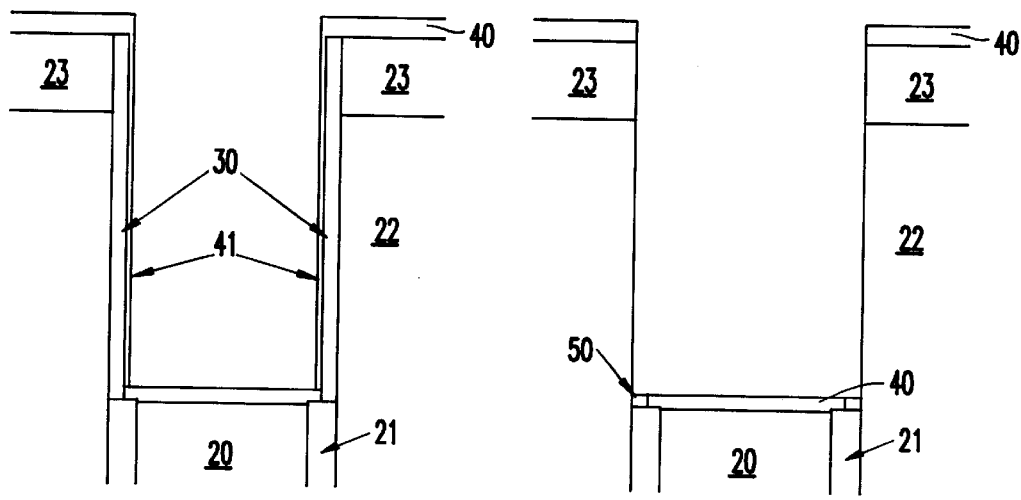
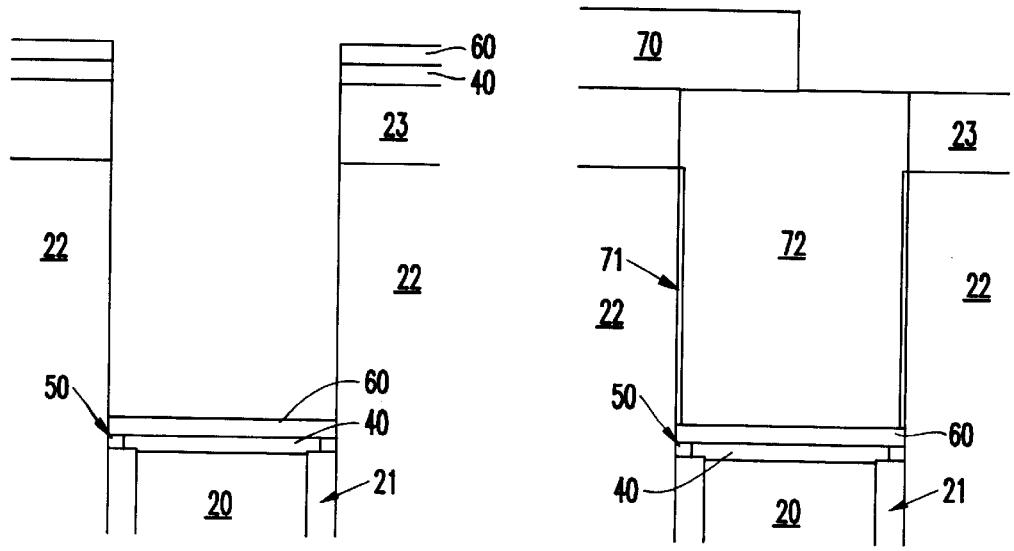

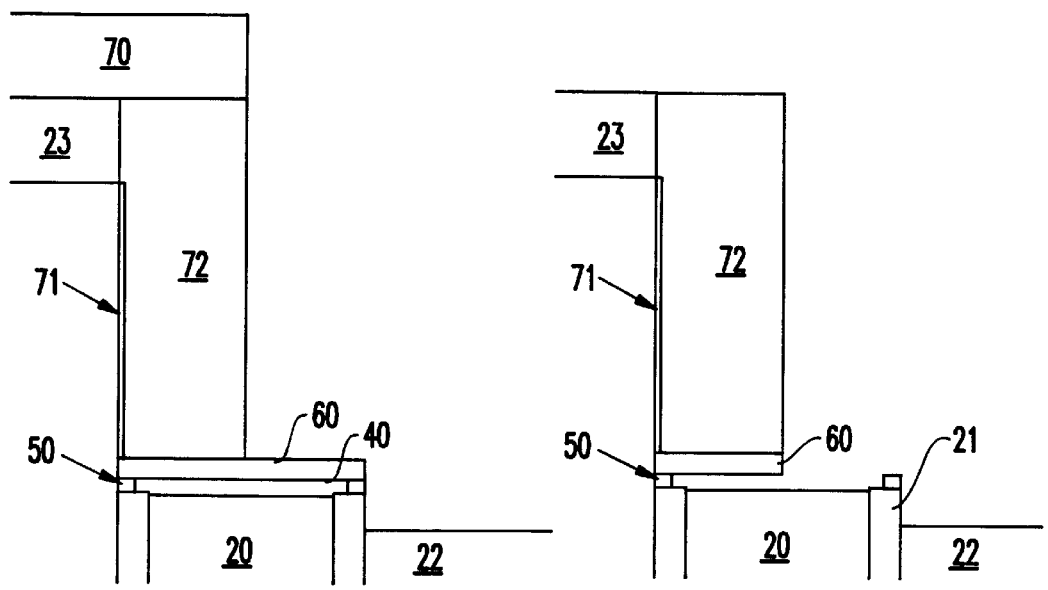
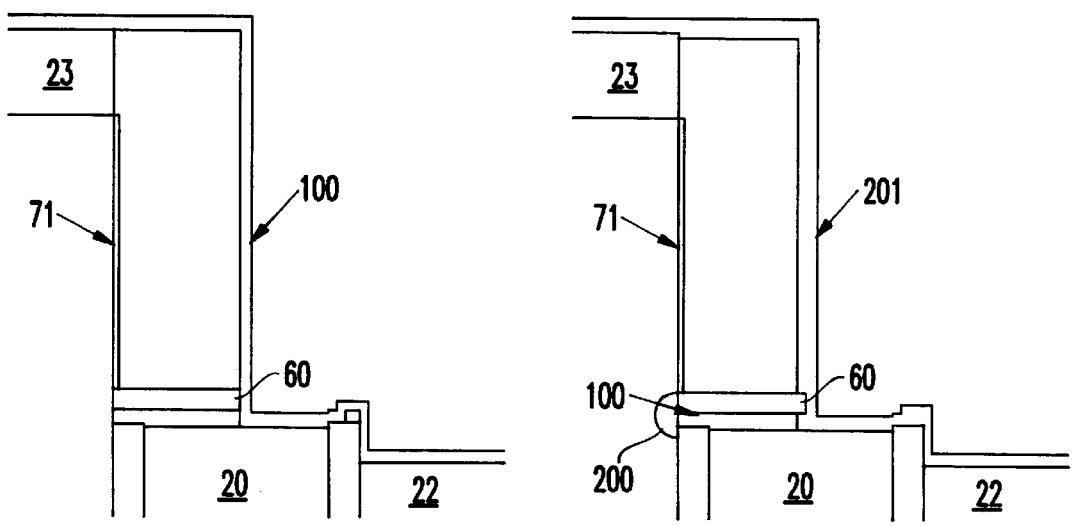

STRUCTURE AND METHOD FOR BURIED-STRAP WITH REDUCED OUTDIFFUSION

CROSS-REFERENCE TO RELATED APPLICATIONS

This application is a divisional of U.S. patent application Ser. No. 09/255,534, filed Feb. 22, 1999.

BACKGROUND OF THE INVENTION

1. Field of the Invention

The present invention generally relates to integrated circuits and more particularly to an improved method and structure which reduces the size of semiconductor devices.

2. Description of the Related Art

Integrated circuit devices are continually being made smaller in order to increase speed, make the device more portable and to reduce the cost of manufacturing the device. However, certain designs have a minimum feature size which cannot be reduced without compromising the integrity of electrical isolation between devices and consistent operation of the device.

For example, dynamic random access memory devices (DRAMs) which use planar metal oxide semiconductor field effect transistors (MOSFETs) with deep trench (DT) storage capacitors have a minimum features size of approximately 0.15 $\mu$m. Below that size, the internal electric fields exceed the upper limit for storage node leakage which decreases retention time below an acceptable level. Therefore, there is a need for different methods and/or different structures to further reduce the size of integrated circuit devices.

SUMMARY OF THE INVENTION

It is, therefore, an object of the present invention to provide a structure and method for forming an integrated circuit memory device. The method includes forming a conductor in a trench, forming an isolation collar along a perimeter of an upper portion of the trench conductor, forming supporting spacers above the isolation collar, forming a sacrificial layer between the supporting spacers along an upper surface of the trench conductor, forming an insulator above the sacrificial layer, forming a gate conductor above the insulator, removing the sacrificial layer to form a gap between the insulator and the trench conductor (wherein the supporting spacers maintain a relative position of the gate conductor, the insulator and the trench conductor) and forming a conductive strap in the gap.

The trench is formed in a substrate and the method further includes removing a portion of the substrate to expose a sidewall of the gate conductor, the insulator and the sacrificial layer. The removing of the sacrificial layer includes applying a selective plasma or chemical wet etch which removes the sacrificial layer and does not remove the gate conductor or the insulator.

The forming of the conductive strap includes depositing a conductive material in the gap and along sidewalls of the gate conductor and the insulator and oxidizing the conductive material to change the conductive material to an insulator material along the sidewalls of the gate conductor and the insulator while the conductive material remains conductive in the gap to form the strap. The conductive material includes an impurity and the oxidizing releases the impurity from the conductive material to the substrate to create a diffusion region.

Before the forming of the strap, the invention can include forming an insulating spacer material on a sidewall of the gate conductor. Additionally, the method includes, before the forming of the strap, forming a gate oxide layer in the trench.

BRIEF DESCRIPTION OF THE DRAWINGS

The foregoing and other objects, aspects and advantages will be better understood from the following detailed description of preferred embodiments of the invention with reference to the drawings, in which:

FIG. 4 is a schematic diagram of a partially completed integrated circuit structure according to the invention;

FIG. 5 is a schematic diagram of a partially completed integrated circuit structure according to the invention;

FIG. 6 is a schematic diagram of a partially completed integrated circuit structure according to the invention;

FIG. 7 is a schematic diagram of a partially completed integrated circuit structure according to the invention;

FIG. 8 is a schematic diagram of a partially completed integrated circuit structure according to the invention;

FIG. 9 is a schematic diagram of a partially completed integrated circuit structure according to the invention;

FIG. 10 is a schematic diagram of a partially completed integrated circuit structure according to the invention;

FIG. 11 is a schematic diagram of a partially completed integrated circuit structure according to the invention;

DETAILED DESCRIPTION OF PREFERRED EMBODIMENTS OF THE INVENTION

As discussed above, certain integrated circuit structures, such as DRAMs which use planar MOSFETS and deep trench storage devices, can reach a minimum features size. However, a different structure, such as a vertical access transistor, may be utilized with deep trench storage DRAM arrays or other buried conductor layers to further reduce the minimum feature size.

For example, deep trench storage DRAM arrays or other buried conductor layers utilizing vertical access transistors may be scaled to at least a minimum feature size of 0.10 $\mu$m. Although viable design points exist for "vertical" DRAM which greatly exceed the density capability of "planar" DRAM designs, the invention identifies key focus areas which would further improve the robustness and/or density capability of "vertical" DRAM.

Figure 1:
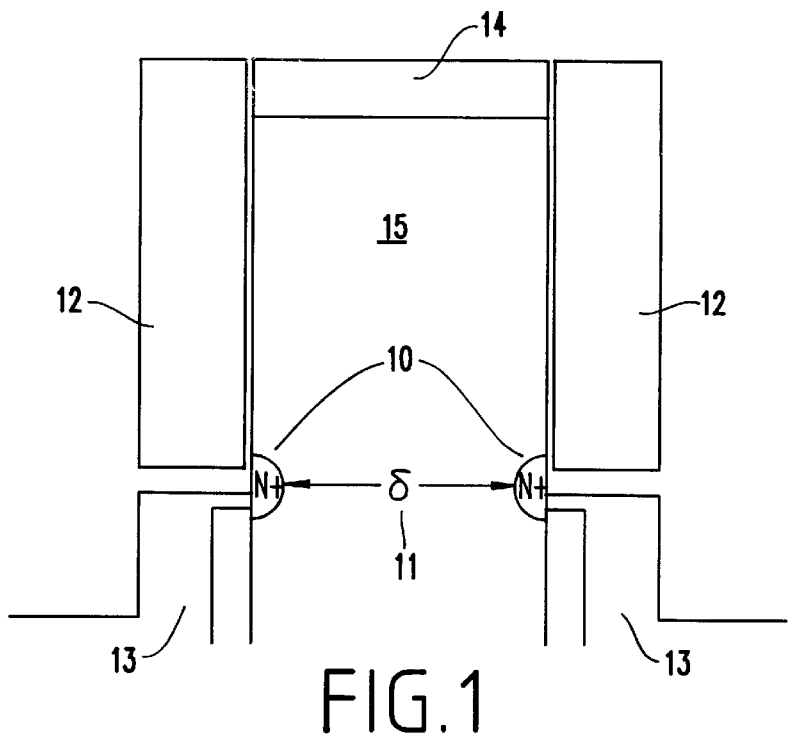
FIG. 1 is a schematic diagram of an integrated circuit storage device with a vertical transistor.

One such focus area is the buried-strap outdiffusion. As illustrated by the back to back cells shown in FIG. 1, the distance 11, δ, between the buried-strap outdiffusions 10 of adjacent cells is a key parameter. FIG. 1 also illustrates gate conductors 12, deep trench capacitors 13 and a bitline diffusion region 14. The minimum value of δ is determined principally by the minimum feature size F, the design distance between adjacent cells, and the amount of outdiffusion from the buried-strap.

Small values of δ result in static and/or dynamic coupling between adjacent cells, which degrades data retention time. Within certain limits, this coupling may be reduced by increasing the doping between buried-strap outdiffiisions 10 within the silicon mesa 15 shared by the cells. However, a maximum doping concentration is reached at which storage node leakage is compromised by resultant high electric fields. Thus, one objective of this invention is to maximize δ for a given cell design and minimum feature size and to minimize the amount of outdiffusion 10 from the buried-strap.

Figures 2, 3:
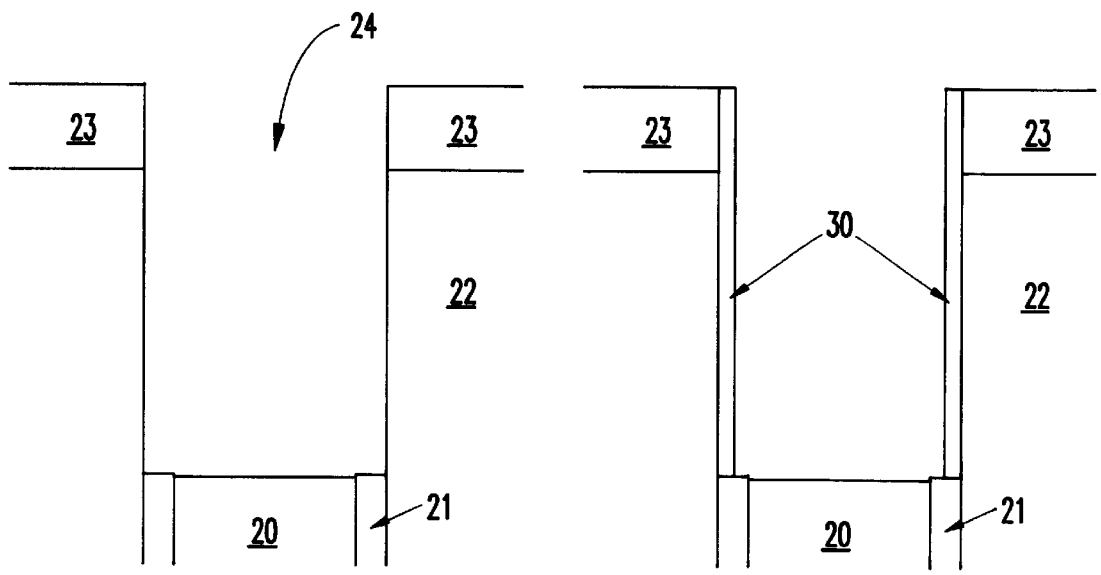
FIG. 2 is a schematic diagram of a partially completed integrated circuit structure according to the invention.
FIG. 3 is a schematic diagram of a partially completed integrated circuit structure according to the invention.

The invention achieves these goals by using the structure and method described below. A first embodiment is illustrated in FIGS. 2–12. More specifically, FIG. 2 illustrates the very upper portion of a deep trench 24 formed in a substrate (e.g., silicon) structure 22 having a dielectric (e.g., oxide or nitride) upper pad surface 23. The trench/substrate can be formed using any of many well known formation and patterning techniques, such as chemical vapor deposition (CVD) or physical vapor deposition (PVD) of the pad dielectric 23 over a silicon substrate 22 which is masked and etched to form the deep trench 24.

The deep trench 24 is filled with a conductive material 20, such as N+ polysilicon, the upper portion of which is surrounded by a collar dielectric 21. The deep trench conductor 20 and collar dielectric 21 can be formed using any of a number of well known techniques. For example, the trench can be lined with an insulating dielectric (not illustrated) and then partially filled with a first level of conductor material. Then, the collar dielectric 21 (such as silicon dioxide) can be deposited. The collar oxide is etched in, for example, an anisotropic dry etch process such as reactive ion etching (RIE) using a mixture of gases which may include some portions of CHF3, Ar, 02, C4F8, and CO. The anisotropic dry etch, or sidewall spacer etch, removes material in a vertical direction at a high rate, but removes material in the horizontal direction at a relatively low rate. The highly selective anisotropic spacer etch leaves material along the sidewall of the trenches but removes material from the horizontal surfaces. The trench 24 is then partially filled with a second level of conductor 20. Then, the collar dielectric 21 is etched down to be level with the top surface of the second level of polysilicon 20.

Referring now to FIG. 3, a thin layer of a conductor 30, such as intrinsic or lightly P-doped amorphous silicon or polysilicon, is deposited and reactive ion etched to form spacers lining the sidewalls of the upper portion of the deep trench 24. It is preferable to avoid N-type or heavily P-type dopants to assure that the vertical sidewall of the trench 24 is not contaminated. A layer of high density plasma insulator or "placeholder" 40, such as tetraethylorthosilicate (TEOS), is deposited as illustrated in FIG. 4. This layer 40 deposits directionally, substantially on the horizontal surfaces. It is not critical if the high density plasma 40 tetraethylorthosilicate forms on the sidewalls 41, as it will be removed later, as long as it is substantially thicker on horizontal surfaces than on vertical surfaces. For example, a short isotropic etch can be used to remove the small amount of high density plasma 40 (e.g., tetraethylorthosilicate) from the vertical sidewalls 41. The final thickness of this layer on horizontal surfaces is preferably in the range of 10–30 μm.

The HDP TEOS may be optionally doped using ion implantation to increase its etch rate for a later process step. For example, suitable dopants may include boron, arsenic, phosphorus and argon. The presence of the dopant in the HDP oxide introduces damage to the oxide which dramatically increases its etch rate. As another alternative to doping the HDP oxide, a layer of Amorphous Silicon Gas ASG may be deposited and cleared from the trench sidewalls using well known resist processes.

Then the exposed poly or amorphous silicon 30 on the sidewalls is removed with an isotropic etch. This leaves a short conductive (e.g., polysilicon) supporting spacer 50 along the inside of the deep trench, above the top of the isolation collar 21, as shown in FIG. 5. The short supporting spacers 50 provide mechanical support for the overlying gate conductor formed later.

A layer of high density plasma insulator 60 (e.g., nitride) is deposited as shown in FIG. 6. If the HDP or deposited oxide layer is doped, as described above, layer 60 may preferably consist of a HDP deposited undoped oxide. The enhanced etch rate of a doped oxide layer 40 will allow its subsequent removal selective to the overlying undoped oxide layer 60. As a result of the lower dielectric constant of an oxide layer 60, rather than nitride, the gate to storage node coupling capacitance may be decreased. This layer 60 will serve as the trench top insulator between the storage node conductor 20 and the gate conductor. After the deposition of the layer of dielectric 60, the sidewalls are stripped of any traces of the trench top insulator 60 using, for example, an isotropic dry or wet nitride etchant.

The remaining trench top insulator 60 is preferably thick enough (e.g., 5–25 μm) to provide reliable insulation. Using well known methods, the self-aligned sacrificial oxide (not shown) is grown, the array channel angled implants are performed and the self-aligned sacrificial oxide is stripped.

Then, a gate dielectric 71 (e.g., oxide) is grown, as shown in FIG. 7. A gate conductor 72 (e.g, polysilicon, metal or alloy) is then deposited and planarized using conventional processes such as CVD and chemical mechanical polishing (CMP). In the course of the planarization process, any remaining nitride 60 and dielectric 40 (oxide) over the pad material 23 is removed. An active area photoresist 70 is then formed and patterned, using conventional deposition and lithographic processes.

In FIG. 8, using the active area photoresist 70 pattern, the exposed pad 23 is removed using an anisotropic nitride etch (RIE), for example, if the pad 23 is a nitride pad. The substrate 22 and conductor 72 are etched selectively to the insulator 60. Thus, the etchant used etches the substrate 22 and the conductor 72 at a much faster rate that it etches the insulator 60. This exposes a portion of the layer 60 in the deep trench.

The exposed portion of the insulator 60 is reactive ion etched (e.g., from the horizontal surfaces) selective to the substrate 22, the spacers 50, the conductor 72, the conductor 20 and the pad 23. For example, if the spacers 50, conductor 72 and conductor 20 are polysilicon, the insulator 60 and pad 23 are nitride, the substrate 22 is silicon and the collar insulator 21 is an oxide, the etchant is preferably a nitride reactive ion etch which does not significantly etch silicon, polysilicon, or oxide, such as a plasma containing $CH_3F$ Alternatively, the reactive ion etch may be one that is commonly used to etch silicon and nitride for well known STI etch processes. This type of etch removes the nitride layer 60, exposing oxide layer 40, and etches slightly into the silicon 22. In the course of this alternative etch, the exposed portion of supporting polysilicon 50 is thinned or completely removed. The etch may be followed by a high temperature oxidation step to provide rounding of the silicon corners.

Then, the exposed high density plasma dielectric 40 is selectively isotropically etched to produce a gap between the conductor 20 and the insulator 60 shown in FIG. 9. Again, if the spacers 50, conductor 72 and conductor 20 are polysilicon, the insulator 60 and pad 23 are nitride, the substrate 22 is silicon and the collar insulator 21 an oxide the etchant, preferably wet $HF/H_2SO_4$ or HF vapor is used. The foregoing etch rate differential between the dielectric layer 40 and the collar 21 is used to remove the dielectric 40 without causing excessive etching of the collar insulator 21.

The short spacers 50 provide mechanical support for the overlying gate conductor 72 and insulator layer 60. Without the spacers 50, the conductor 72 may be subject to mechanical dislocation.

In FIG. 10 a thin doped conductor 100, such as a layer of intrinsic or lightly doped P-type poly or amorphous silicon is deposited. The conductor 100 is deposited using, for example, chemical vapor deposition, so that the conductor 100 fills the void under the insulator 60.

The thin conductor layer 100 and the right hand spacer 50 are then oxidized under conditions such that the conductor 100 becomes an insulator 201 to define the active area. For example, an oxidization utilizing well known dry or wet oxidation techniques would completely oxidize away the thin conductor layer 100 in all areas except for under the insulator 60. The thin conductor 100 remaining under the insulator 60 will provide the conductive strap between the deep trench conductor 20 and the gate diffusion region 200. Complete oxidation of the conductor 100 on the exposed surfaces creates an insulator 201 which prevents wordline to node shorts.

During the foregoing thermal oxidizing step, dopant (e.g., N+) from the conductor 20 diffuses through the strap region and forms a shallow junction (e.g., diffusion region) 200 in the single crystal silicon 22, as shown in FIG. 11.

Figure 12:
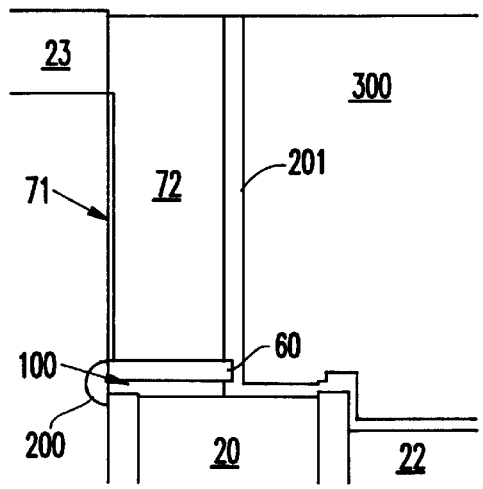
FIG. 12 is a schematic diagram of a partially completed integrated circuit structure according to the invention.

FIG. 12 illustrates a shallow trench isolation oxide 300 that is deposited and planarized. Conventional processing follows for wordline formation, source/drain diffusions, bitline wiring, and all other higher levels of wiring and insulation, etc. to form the structure shown in FIG. 1.

The above structure and method maximizes the distance 11 between a strap diffusion edge and the same region of an adjacent cell. The insulator layer 40 acts as a placeholder for the strap 100 which will be formed subsequently. Thus, only the placeholder 40 is present during most of the high temperature oxidation steps which prevents the strap 100 from having to undergo those high temperature steps. For example, the insulator 40 is present during the sacrificial gate oxidation (not illustrated) and the gate oxidation 71. In previously practiced processes these oxidation steps contribute significantly to the thermal budget of the strap outdiffusion.

By forming the doped conductive layer 100 after these oxidation steps, the amount of dopant which defuses into the difflusion regions 200 is substantially less than the amount of diffusion seen in the conventional structures and processes. Therefore, the distance between the strap diffusion regions 11 is maximized with the invention, which allows smaller features and increases circuit density, thereby increasing the number of chips available per wafer and decreasing manufacturing costs.

Additionally, the invention produces a structure which includes spacers 50 and is advantageous because the spacers allow the removal of the placeholder 40 without risking mechanical collapse of the structure.

Figure 13:
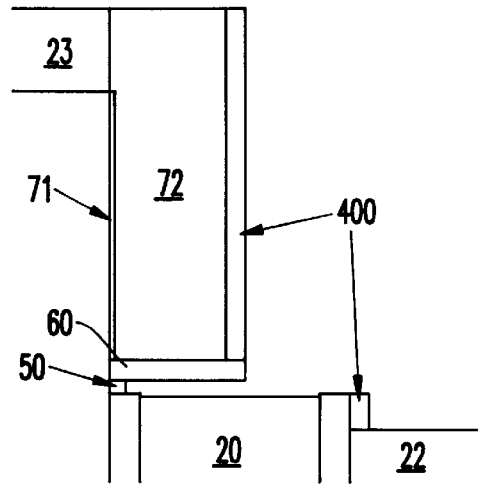
FIG. 13 is a schematic diagram of a partially completed integrated circuit structure according to the invention.
Figure 14:
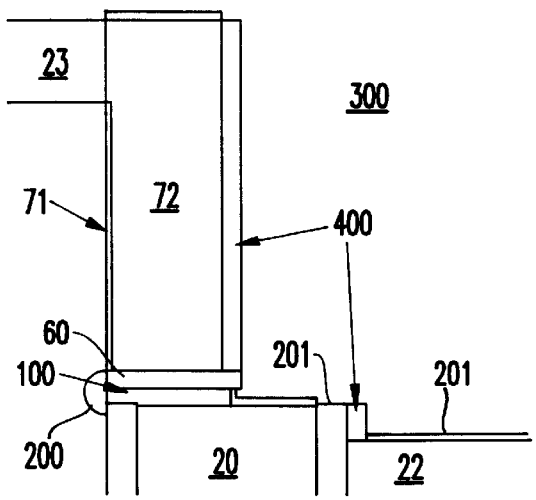
FIG. 14 is a schematic diagram of a partially completed integrated circuit structure according to the invention.

A second embodiment of the invention improves the gate to node short reliability (e.g., decreases the number of shorts), without having to depend on complete oxidation of the thin conductive layer 100 as shown in FIG. 11. The process and structure of the second embodiment are similar to the first embodiment, except for the following differences. After removal of the active area photoresist 70 shown in FIG. 8, a layer of nitride 400 is deposited and reactive ion etched to form spacers 400 on the exposed gate conductor 72 sidewall. At this point a high temperature oxidation may optionally be performed to control the radius of curvature of the silicon corners. The exposed high density plasma insulator 40 is removed using the same processing discussed above with respect to FIG. 9, as shown in FIG. 13.

Figure 15:
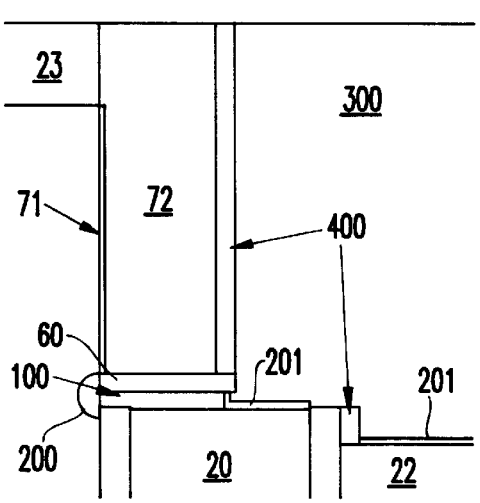
FIG. 15 is a schematic diagram of a partially completed integrated circuit structure according to the invention.

Using the same or similar methods discussed above with respect to FIGS. 10–12, a thin conductive layer 100 is formed within and the gap between the insulator 60 and the deep trench conductor 20 and along the sidewall surfaces of the insulator 400. The conductor 100 is converted to an insulator 201 through an oxidation process which also forms the strap diffusion regions 200. Alternatively, the conductor 100 is removed by a chemical dry etch (CDE) which results in the absolute minimum amount of strap outdiffusion. The outdiffusion is minimized for this case since the contact area between the conductor 100 and underlying storage capacitor poly 20, which provides the dopant source for the strap diffusion, is reduced. As shown in FIG. 15, the STI 300 is formed, as discussed above.

With the second embodiment of the invention the likelihood of a short between the wordline and the node is reduced, even when compared to the previous embodiment, because the nitride layer 400 on the gate conductor sidewall provides superior resistance to shorting, relative to the oxide 201 used in the first embodiment.

Figure 16:
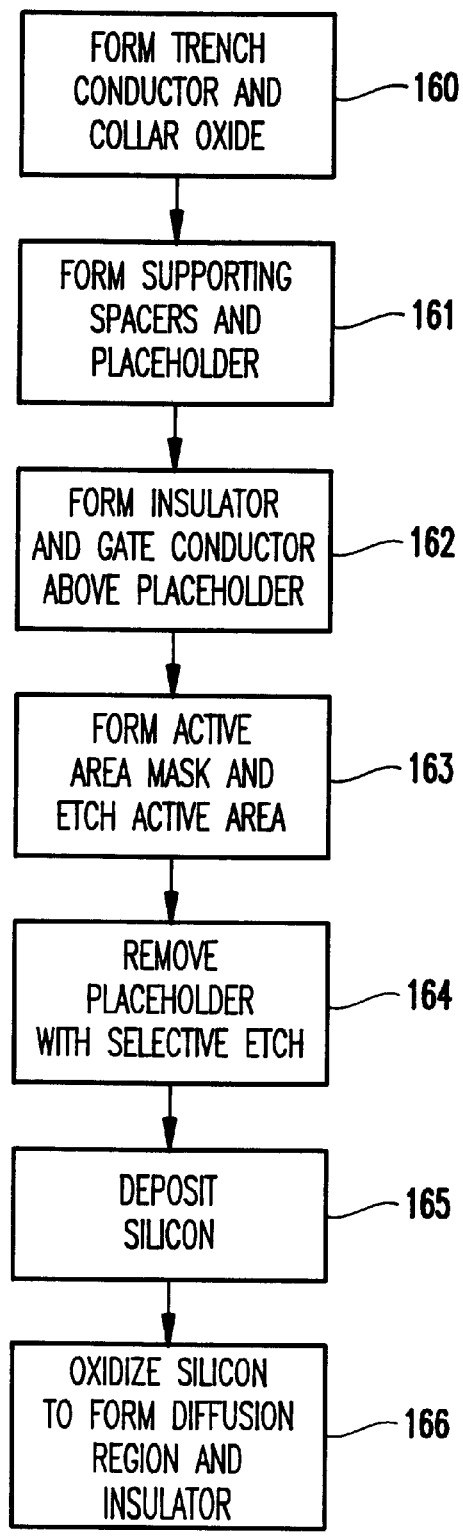
FIG. 16 is a flow diagram illustrating a preferred method of the invention.

FIG. 16 is a flowchart representation of an embodiment of the invention. More specifically, FIG. 16 illustrates the formation of the trench conductor 20 and the collar oxide 21 in item 160. Then, the supporting spacers 50 and the placeholder 40 are formed, as shown in FIG. 5, in item 161. In item 162, the insulator 60 and the gate conductor 72 are formed as shown in FIG. 7. Next the active area mask 70 is used to etch the active area, as shown in FIG. 8, in item 163. In item 164, the placeholder 40 is removed, as shown in FIG. 9. In item 165 the silicon 100 is deposited, as shown in FIG. 10. In item 166, the silicon 100 is oxidized to form the difflusion region 200 and the insulator 201.

While the invention has been described in terms of preferred embodiments, those skilled in the art will recognize that the invention can be practiced with modification within the spirit and scope of the appended claims.

What is claimed is:

1. An integrated circuit memory device comprising:
   a substrate having a trench;
   a trench conductor within said trench;
   a conductive strap within said trench above said trench conductor, wherein said conductive strap includes a supporting spacer;
   an insulator above said conductive strap;
   a gate conductor above said insulator; and
   a diffusion region in said substrate adjacent said conductive strap,
   wherein said supporting spacer maintains a relative position of said gate conductor, said insulator and said trench conductor.

2. The integrated circuit in claim 1, wherein said supporting spacer is positioned in said trench adjacent said diffusion region.

3. The integrated circuit in claim 2, wherein said supporting spacer has a material difference from said conductive strap, wherein said material difference relates to said conductive strap having undergone less thermal cycles than said supporting spacer.

4. The integrated circuit in claim 1, wherein said trench conductor has a material difference from said conductive strap, wherein said material difference relates to said conductive strap having undergone less thermal cycles than said trench conductor.

5. The integrated circuit in claim 4, further comprising a nitride-based second insulator running along a vertical surface of said gate conductor and along a vertical surface of said trench conductor on a side opposite said diffusion region.

6. The integrated circuit in claim 1, wherein said insulator comprises a nitride-based material.

7. An integrated circuit memory device comprising:
   a substrate having a trench;
   a trench conductor within said trench;
   a conductive strap within said trench above said trench conductor, wherein said trench conductor has a material difference from said conductive strap, wherein said material difference relates to said conductive strap having undergone less thermal cycles than said trench conductor;
   an insulator above said conductive strap;
   a gate conductor above said insulator; and
   a diffusion region in said substrate adjacent said conductive strap,
   wherein said conductive strap includes a supporting spacer that maintains a relative position of said gate conductor, said insulator and said trench conductor, wherein said supporting spacer is positioned in said trench adjacent said diffusion region.

8. The integrated circuit in claim 7, wherein said supporting spacer has a material difference from said conductive strap, wherein said material difference relates to said conductive strap having undergone less thermal cycles than said supporting spacer.

9. The integrated circuit in claim 7, further comprising a nitride based second insulator running along a vertical surface of said gate conductor and along a vertical surface of said trench conductor on a side opposite said diffusion region.

10. The integrated circuit in claim 7, wherein said insulator comprises a nitride based material.

11. An integrated circuit memory device comprising:
    a substrate having a trench;
    a trench conductor within said trench;
    a conductive strap within said trench above said trench conductor,
    a first insulator above said conductive strap;
    a gate conductor above said insulator;
    a diffusion region in said substrate adjacent said conductive strap; and
    a nitride based second insulator running along a vertical surface of said gate conductor and along a vertical surface of said trench conductor on a side opposite said diffusion region.

12. The integrated circuit in claim 11, wherein said conductive strap includes a supporting spacer that maintains a relative position of said gate conductor, said insulator and said trench conductor.

13. The integrated circuit in claim 12, wherein said supporting spacer is positioned in said trench adjacent said diffusion region.

14. The integrated circuit in claim 1, wherein said supporting spacer has a material difference from said conductive strap, wherein said material difference relates to said conductive strap having undergone less thermal cycles than said supporting spacer.

15. The integrated circuit in claim 1, wherein said trench conductor has a material difference from said conductive strap, wherein said material difference relates to said conductive strap having undergone less thermal cycles than said trench conductor.

* * * * *